United States Patent
Chang et al.

(10) Patent No.: US 6,255,978 B1
(45) Date of Patent: Jul. 3, 2001

(54) SERIAL PIPELINE DAC WITH GAMMA CORRECTION FUNCTION

(75) Inventors: Chia-Yuan Chang, Hsinchu; Yong-Noen Rao, Taichung, both of (TW)

(73) Assignee: Industrial Technology Research Institute, Hsinchu Hsien (TW)

( * ) Notice: Subject to any disclaimer, the term of this patent is extended or adjusted under 35 U.S.C. 154(b) by 0 days.

(21) Appl. No.: 09/395,199

(22) Filed: Sep. 14, 1999

(51) Int. Cl.$^7$ ....................................................... H03M 1/36
(52) U.S. Cl. ........................... 341/155; 341/151; 341/161; 341/159; 341/158; 341/160; 341/120
(58) Field of Search ..................................... 341/155, 161, 341/158, 159, 160, 120, 121, 118

(56) References Cited

U.S. PATENT DOCUMENTS

| | | | |
|---|---|---|---|
| 5,416,485 | * | 5/1995 | Lee . |
| 5,583,503 | * | 12/1996 | Kusakabe . |
| 5,594,445 | * | 1/1997 | Ginetti . |
| 5,764,176 | * | 6/1998 | Ginetti . |
| 5,990,820 | * | 11/1999 | Tan . |

* cited by examiner

*Primary Examiner*—Brian Young
*Assistant Examiner*—Lam T. Mai
(74) *Attorney, Agent, or Firm*—Nath & Associates PLLC; Harold L. Novick

(57) ABSTRACT

A method and apparatus for converting digital input signal to analog voltage are disclosed herein. The converting apparatus includes the following devices device. One of the pair of reference voltage selecting means is used to select a first voltage level as a first power source. Similarly, a second voltage level is selected as a second power source. The pair of controlled selectively coupling devices couples the first power source or the second power source as the charge power source responding to voltage level of every bit of the second portion of the digital input signal. The voltage cumulating device is used to generate the analog voltage by alternatively charging and redistributing the output capacitor with the first and the second capacitor. The foregoing method includes the following steps. At first, divide reference voltage levels into a first set and a second set of reference voltage levels. Then select a first and a second voltage level from the first and the second set of reference voltage levels as a first and a second power source respectively according to coding of a first portion of said digital input signal. Sequentially select the first power source or the second power source as a charge power source. The output capacitor is electrically coupled to the first storage capacitor or the second storage capacitor, then voltage on said output capacitor being equal to the analog voltage.

19 Claims, 6 Drawing Sheets

SERIAL PIPELINE DAC WITH GAMMA CORRECTION FUNCTION

BACKGROUND OF THE INVENTION

1. Field of the Invention

This invention relates to digital-to-analog converting apparatus, and more particularly, to digital-to-analog converting apparatus with gamma correction function, which can be utilized in a data driver of a liquid crystal display (LCD) panel.

2. Description of the Prior Art

In a liquid display crystal (LCD) panel, the data driver is a widely used fundamental element, and is utilized in profusion. Besides, the data driver generates the voltage applied on the LCD cell, and the transparence of a LCD cell is non-linearly proportional to the voltage applied on the LCD cell. So it is necessary for the DAC (Digital to Analog Converter) in a digital data driver to be capable of compensating the non-linear relationship between the voltage applied on the LCD cell and the transparence of the LCD cell. The compensation mentioned above is so called Gamma correction, which enables the control of the LCD cells connected to the output terminal of the data driver. Whereas the traditional DAC with Gamma correction function occupies a great deal of the areas of the LCD panel, so it is important to minimize the area of the traditional DAC with Gamma correction function when trying to reduce the volume of the LCD panel.

In general, the relationship between the voltage applied on the LCD cell and the transparence (T) of the LCD cell can be expressed as the curve 10 shown in FIG. 1A. It is noted that the curve 10 is not a straight line, so the relationship between the output voltage and the input code of the data driver is designed to be a curve. The curve mentioned above can be expressed as the curve 11 (FIG. 1B), which stands for the relationship between the output voltage and the input code of the data driver. Because the design of the reference voltage levels, the transfer curve of the of the output voltage of the data driver versus the transparence (T) of the LCD cells coupling to the data driver is a straight line. In other words, the design of the reference voltage level is to enable the mapping relationship between the transparence and the output voltage to be a straight line 12 (FIG. 1B). Through the design of the reference voltage levels of the DACs, the data driver electrically coupling to the DACs mentioned above has the Gamma correction function.

FIG. 2 illustrates the configuration of the LCD panel 15 coupling with the data driver 18, which comprising DAC 20. Each LCD cell in the column of the LCD panel is driven by the voltage generated by the data driver 18, and the data driver 18 includes DAC 20. Take the LCD having the resolution of 1024 multiplied by 768 as an example, if each data driver has 384 pins, then each LCD panel 15 needs 10 (1024×3÷384) pieces of packaged data driver 18. Every digital signal fed to the DAC 20 is converted to an analog signal, and the data driver 18 applied the analog signal on the column (including every LCD cell) of the LCD panel 15. There are many types of DAC can be utilized in the data driver 18, such as R-DAC which using ROM decoder, and the 2-divided C-DAC which using capacitor. The configuration of the R-DAC is shown in FIG. 3A, in which the external reference voltage levels v0–v8 are fed to the reference voltage generator 25, and every bits of the input digital signal are fed to the reference voltage input terminal. The ROM decoder 30 includes MOS switches (not shown) which connecting the column and row lines. Thus the voltage levels generated by the reference voltage generator 25 are coupled to the input terminals in the ROM decoder 30, and the output of the operational amplifier is an analog voltage. Through the data driver 18, the analog voltage is applied to the column of the LCD panel 15 (FIG. 2) to drive every LCD cell.

In the other respect, when the 2-divided C-DAC is utilized in the data driver, the configuration can be as the same type shown in FIG. 3B, which is a 5-bit DAC. The upper 2-bit of the input data are fed to the switching device 35 of the upper 2-bit data processing unit, and the lower 3-bit of the input data are fed to the switching device 36 of the lower 3-bit data processing unit. Thus the input digital signal is converted to an analog signal, and the output voltage of the 2-divided C-DAC is an analog voltage. The external reference voltage levels v0–v7 and v1–v8 are fed to the upper 2-bit data processing unit and the lower 3-bit data processing unit respectively. In order to implement the Gamma correction function within the DAC, the external reference voltage levels (v0–v7) are divided into several portions to provide the reference levels that are to be fed to the DAC. So the transfer curve of the input digital signal versus the output voltage level, i.e., the transfer curve of the digital-to-analog converter, fits the curve 11, which can compensate the non-linearity of the transfer curve of the transparence versus the voltage level applied on the LCD cell. The transfer curve of the input digital signal versus the output voltage level is a curve including 8 sections in piece wise linear that fits the curve 11 in FIG. 1A.

When the R-DAC is utilized in a data driver, the ROM decoder is utilized to decode the input digital signal, thus the corresponding reference voltage of the DAC is acquired, and the corresponding output analog signal is acquired. Because the resistor is utilized in the R-DAC to divide the external reference voltage level to generate the internal reference voltage levels of the DAC, when the gray level of the input digital signal increase, the area of the data driver including the R-DAC will also increase. For example, when the number of the gray level of the input digital signal is 256, the area of the data driver is about 5.3 times larger than that of the data driver using digital input signal having 64 gray levels.

It is noted that when the number of gray levels of the input digital signal is 256, and the input/output transfer curve is divided into 8 linear sections. Thus the R-DAC must use 256 pieces of resistor, 4096 MOS switches, and 256 power lines, so the area of the data driver is very large. Although the 2-divided C-DAC is utilized instead of R-DAC to reduce the area of the data driver, the foregoing 2-divided C-DAC processing input digital signal still need 16 capacitors and 9 power lines. In order to minimize the area of the data driver, further improvement of the design of the DAC is necessary.

SUMMARY OF THE INVENTION

A method and apparatus for converting digital input signal to analog voltage are disclosed herein, the converting apparatus mentioned above includes a pair of reference voltage selecting devices, a pair of controlled selectively coupling devices, and voltage cumulating device.

One of the pair of reference voltage selecting means is used to select a first voltage level from a first set of reference voltage levels to be a first power source. The other of the pair of the reference voltage selecting devices is used to select a second voltage level from a second set of reference voltage levels as a second power source according to the coding of a first portion of the digital input signal. One of the pair of controlled selectively coupling devices couples the first power source responding to voltage level of every bit of the second portion of the digital input signal. The other of the pair of controlled selectively coupling devices couples the first power source responding to voltage level of inverse of each bit of the second portion of the digital input signal. The voltage cumulating device is used to generate the analog voltage by firstly reset, and then alternatively charging and redistributing the output capacitor with the first capacitor and the second capacitor.

The foregoing method utilized to convert a digital signal to an analog voltage includes the following steps. At the begging, generate a starting signal responding to the digital input signal, and generate a first switching signal, a second switching signal, and a third switching signal responding to the starting signal and the clock signal. Then, divide a plurality of reference voltage levels to a first set of reference voltage levels and a second set of reference voltage levels. Then select a first voltage level from the first set of reference voltage levels as a first power source according to coding of bits of a first portion of the digital input signal. Simultaneously select a second voltage level from the second set of reference voltage levels as a second power source according to coding of bits of a first portion of the digital input signal. Sequentially select the first power source or the second power source as a charge power source responding to voltage level of every bit of the second portion of the digital input signal. Thus the first power source or the second power source is sequentially selected as the charge power source within every duration of every bit of the second portion of the digital input signal.

Then proceed with a reset process by charging the first storage capacitor by the charge power source within duration of a first bit of the second portion of the digital input signal, simultaneously, coupling a second storage capacitor and an output capacitor. Next, proceed with a first capacitor charging, second capacitor redistribution process, i.e., charge a first storage capacitor by the charge power source within duration of a second bit of the second portion of the digital input signal. Simultaneously, couple a second storage capacitor to the output capacitor. Then proceed with a first capacitor redistribution, second capacitor charging process, i. e., charge a second storage capacitor by the charge power source within duration of a third bit of the second portion of the digital input signal. Simultaneously couple the second storage capacitor to the output capacitor. Alternatively proceeds with the first capacitor charging, second capacitor redistribution process and the first capacitor redistribution, second capacitor charging process mentioned above until all bits of the second portion of the digital input signal. After the bit next to the last bit of the second portion of the digital input signal having been used to select one of the first power source and the second power source as the charge power source. Finally, the output capacitor is again electrically coupled to one of the first storage capacitor and the second storage capacitor, then voltage on the output capacitor being equal to the analog voltage.

BRIEF DESCRIPTION OF THE DRAWINGS

The above features of the present invention will be more clearly understood from consideration of the following descriptions in connection with accompanying drawings in which.

DESCRIPTION OF THE PREFERRED EMBODIMENT

To minimize the area of the chip size of the data driver, the present invention provides converting apparatus for converting a digital signal to an analog signal. In addition, through the design of division of the reference voltage fed to the converting apparatus, the gamma correction function which can be utilized in a data driver of a liquid crystal display (LCD) panel is enabled. Basically the preferred embodiment of the present invention proposes the converting apparatus utilizing fewer elements than that of the traditional R-DAC and traditional 2-divided C-DAC. So the area of the data driver using the converting apparatus in the preferred embodiment of the present invention is smaller than that of the traditional R-DAC and traditional 2-divided C-DAC. Due to the usage of great amount of data driver within a LCD panel, the chip size of the LCD using the converting apparatus according to the preferred embodiment of the present invention can be greatly reduced.

Figure 1A:
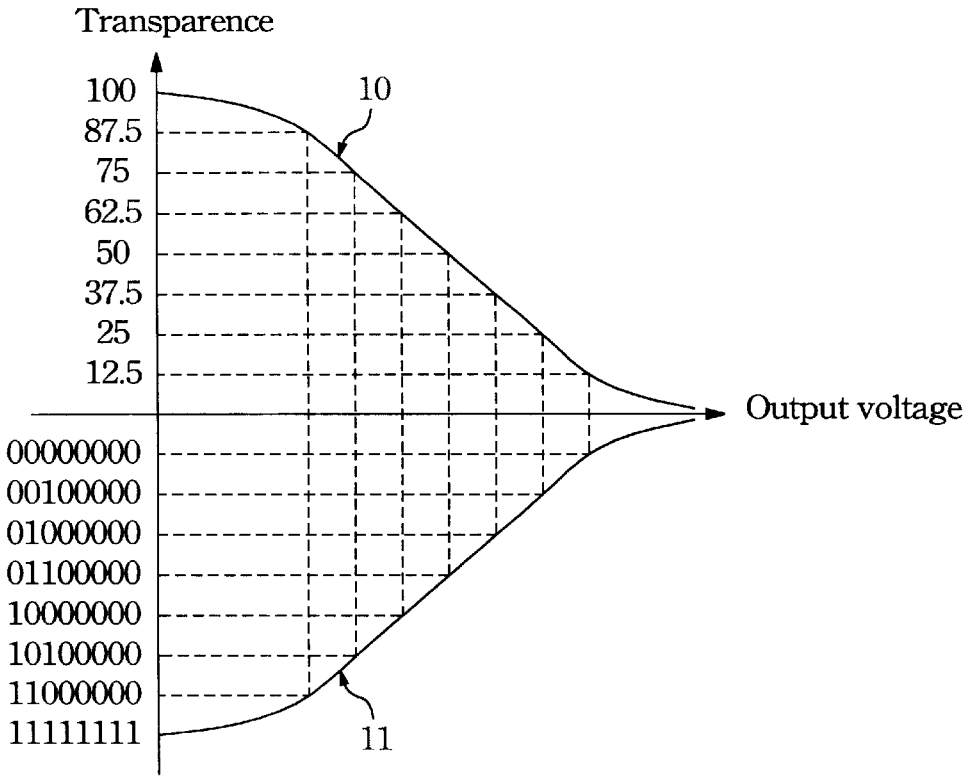
FIG. 1A illustrates the both the transfer curve of transparence of a LCD cell versus the output voltage of the data driver, and the output/input transfer curve of the data driver.
Figure 1B:
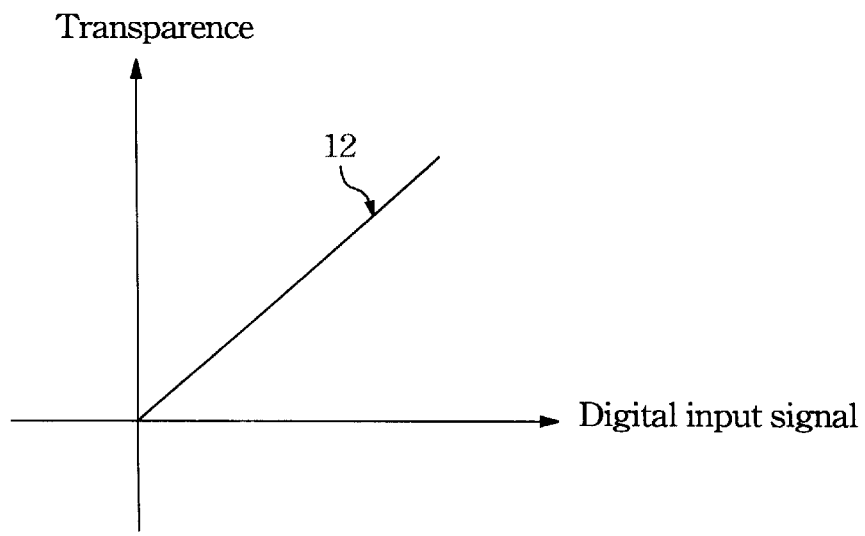
FIG. 1B illustrates the transfer curve of the transparence of the LCD cell versus the reference voltage, which is compensated by the data driver having Gamma correction.
Figure 2:
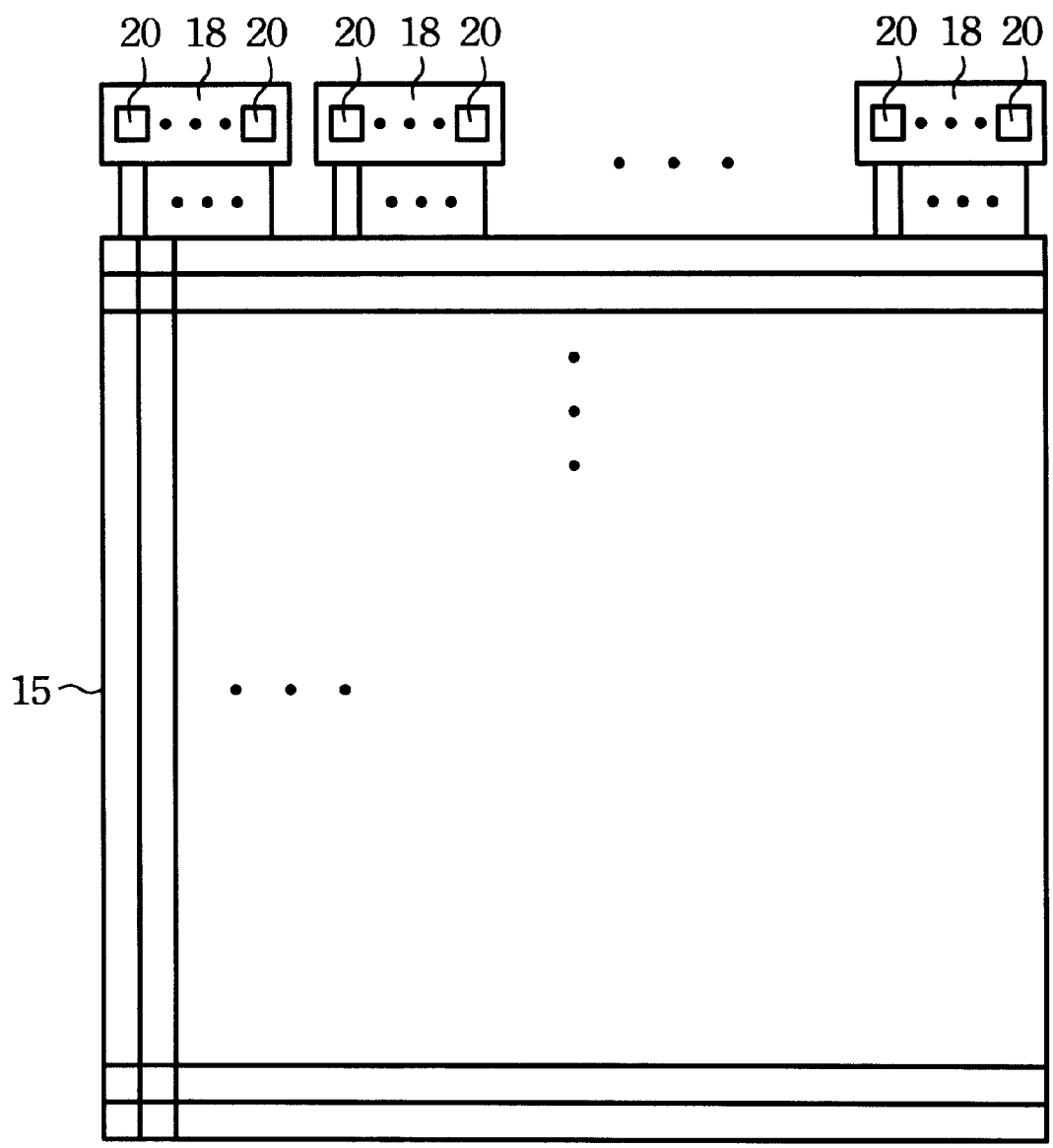
FIG. 2 illustrates the configuration of the LCD panel coupling with the data driver.
Figure 3A:
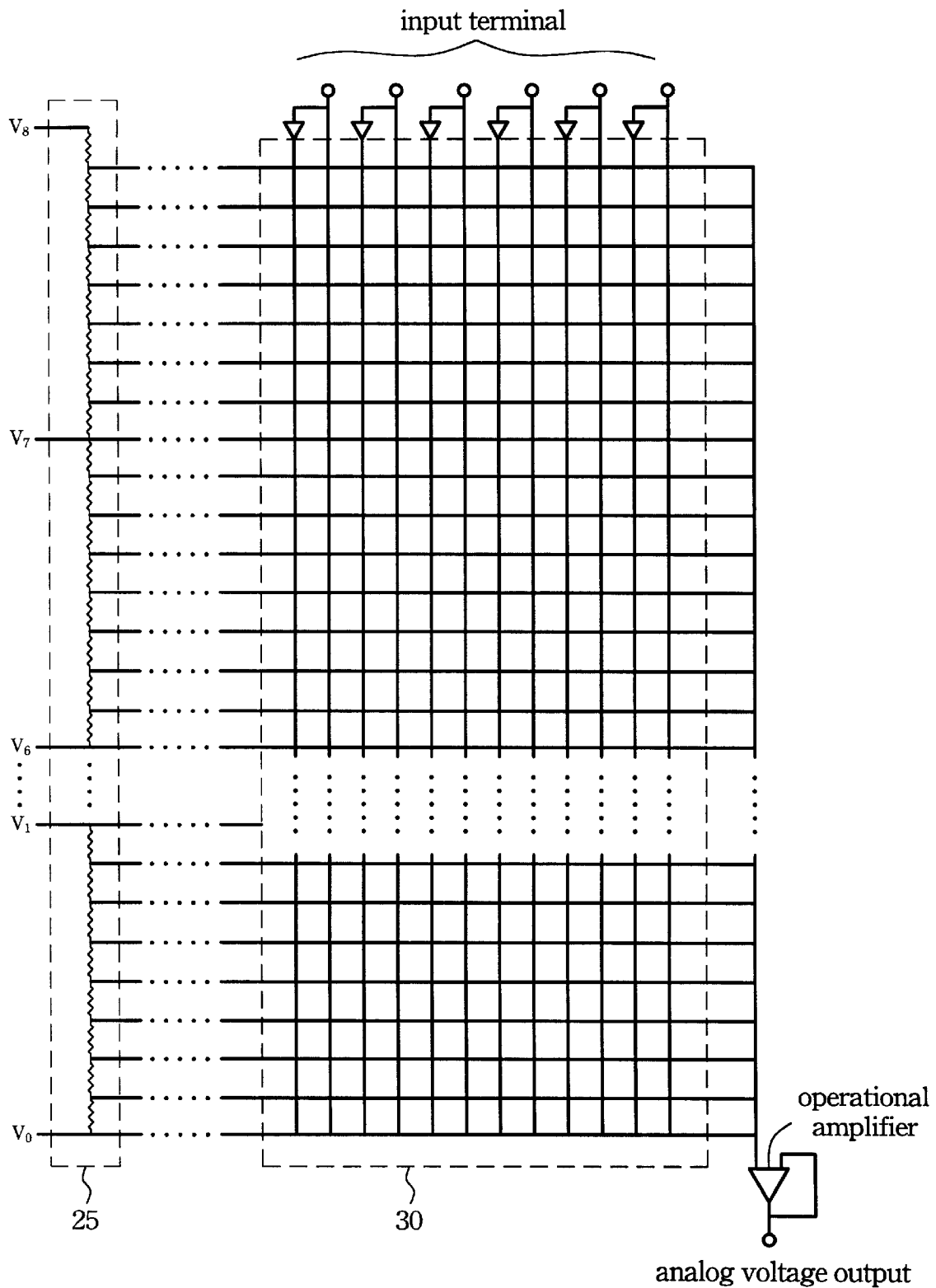
FIG. 3A illustrates the circuit diagram of the traditional R-DAC.
Figure 3B:
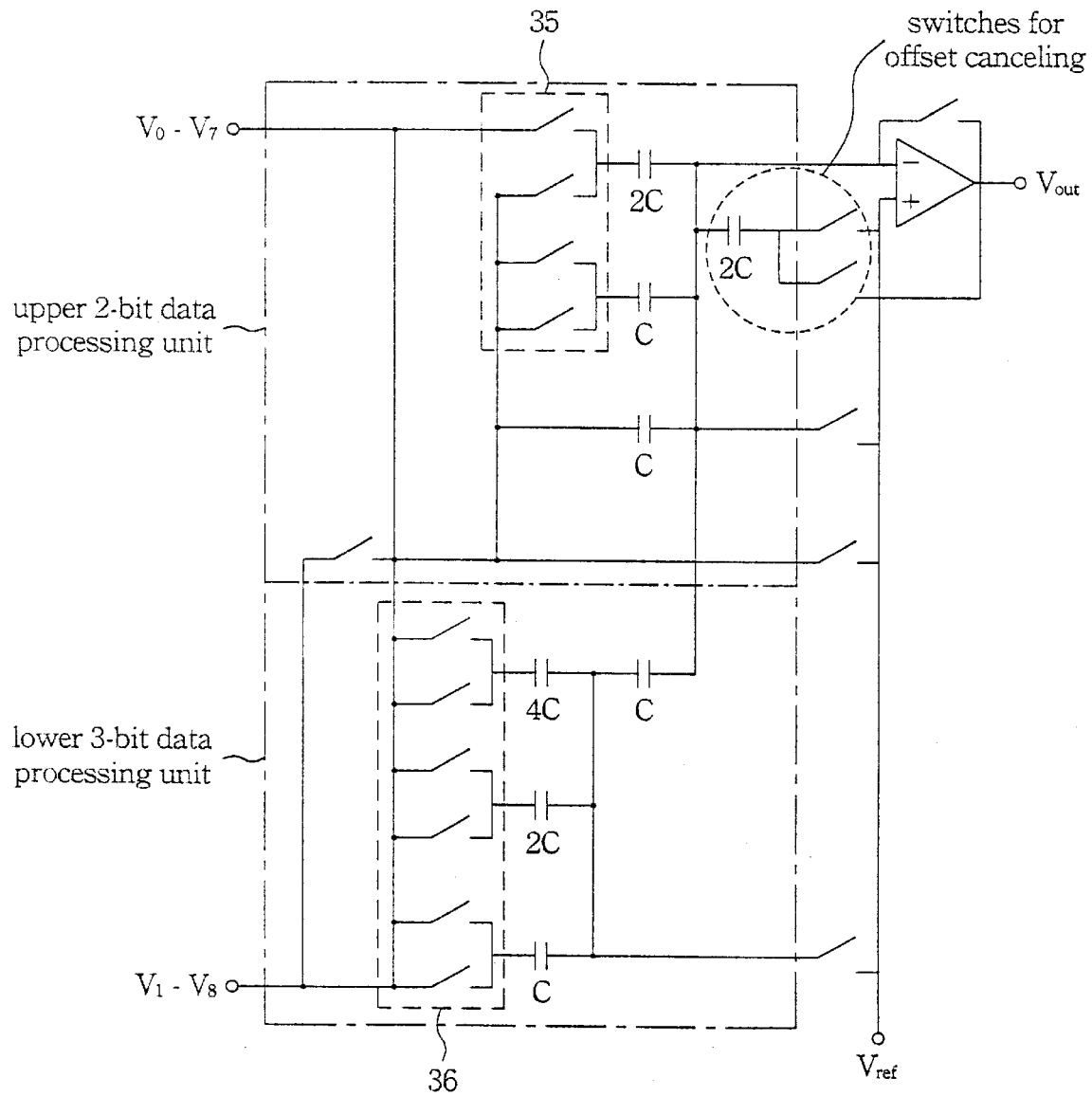
FIG. 3B illustrates the circuit diagram of the traditional 2-divided C-DAC.
Figure 4:
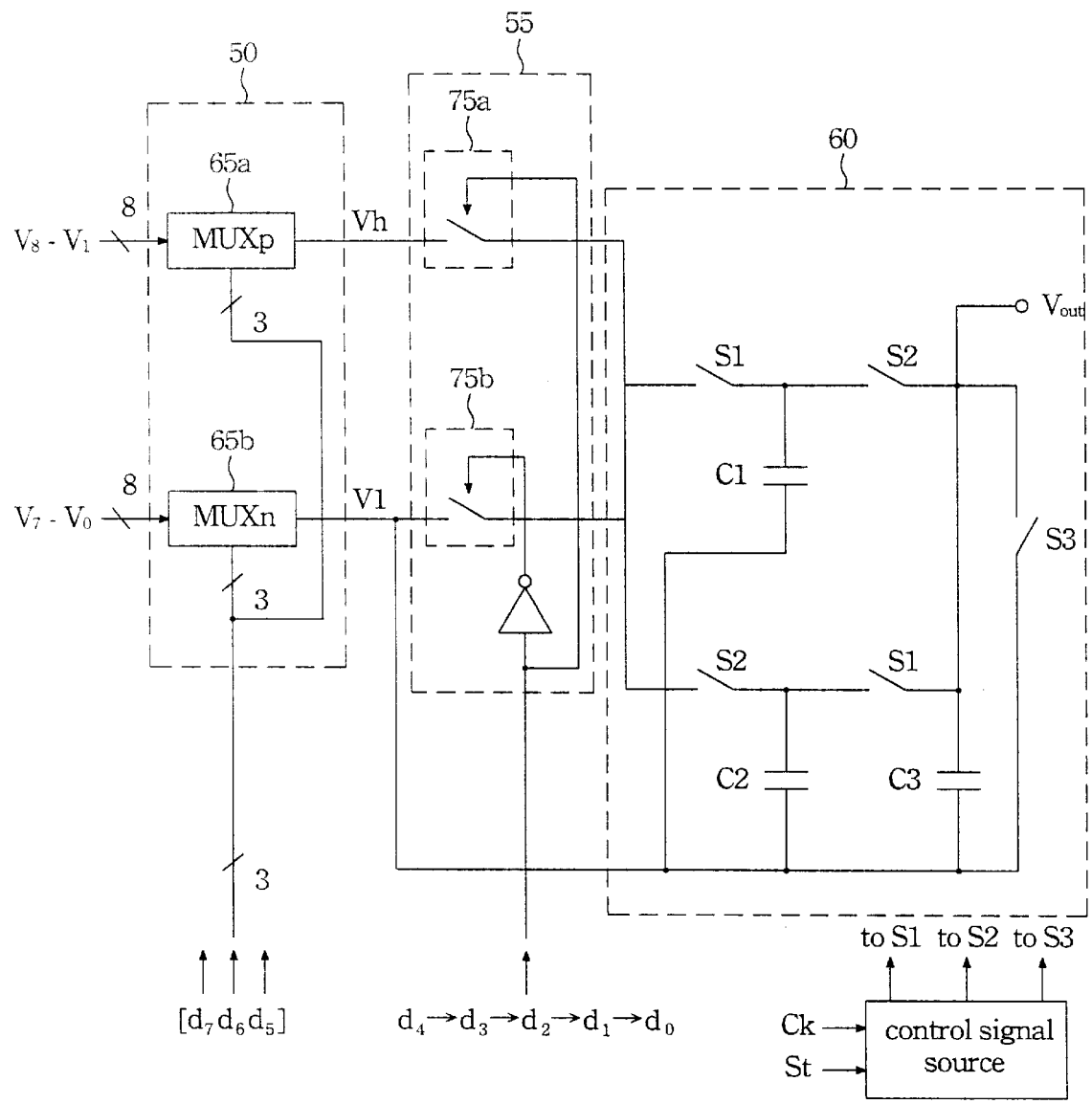
FIG. 4 illustrates the circuit diagram of the DAC according to one preferred embodiment of the present invention.

To describe the operation of the converting apparatus of the present invention, one example of the circuit diagram of the converting apparatus according to the preferred embodiment of the present invention is shown in FIG. 4 accompanied with the description below. Assume the digital input signal is composed of code [d7,d6,d5,d4,d3,d2,d1,d0]. In which the digit d7 at the extreme left position of the code is the most significant bit (MSB); similarly, the digit d0 at the extreme right position is the least significant bit (LSB). The converting apparatus according to the preferred embodiment of the present invention can proceed with the input digital signal to generate a corresponding analog signal, which is analog voltage level relating to the code [d7,d6,d5,d4,d3, d2,d1,d0].

According to the present invention, a plurality of external reference voltage levels v0, v1, v2, v3, v4, v5, v6, v7, and v8 are fed to the reference voltage pair selecting device 50, in which the word "external" means that the plurality of reference voltage levels are generated by a power source (not shown) other than the circuit shown in FIG. 4. In addition, a specific number (such as a pair) of external reference voltage levels are selected from the plurality of external reference voltage levels by a specific number (such as a pair) of multiplexer according to the MSB three bits [d7,d6,d5] of the digital input code. The pair of selected external reference voltage levels are fed to the controlled selectively coupling device 55, then one external reference voltage level of the selected pair of external reference voltage levels is selected, and is coupled to the voltage cumulating device 60. The controlled selectively coupling device 55 is controlled by the LSB five bits [d4,d3,d2,d1, d0].

One of the pair of selected external reference voltage levels is coupled to the voltage cumulating device 60 when everyone of the LSB five bits is subsequently applied on the controlled selectively coupling device 55. The voltage cumulating device 60 is basically a charge storage device that can cumulate the voltage applied on the voltage cumulating device 60 during the LSB five bits [d4,d3,d2,d1,d0] applying on the controlled selectively coupling device 55. Thus the voltage level accumulated on the voltage cumulating device 60 stands for the analog voltage corresponding to the LSB five bits [d4,d3,d2,d1,d0] under the charge voltage (the pair of selected external reference voltage levels) selected in according with the MSB three bits [d7, d6,d5]. In other words, the voltage level accumulated on the voltage cumulating device 60 stands for the analog voltage corresponding to the overall digital input signal [d7,d6,d5, d4,d3,d,2,d1,d0].

In order to precisely describe the preferred embodiment of the present invention, the configuration of every element of the converting apparatus according to the preferred embodiment of the present invention is detailed in FIG. 4. The external reference voltage levels v0, v1, v2, v3, v4, v5, v6, v7, and v8 are parallel transmitted and are divided into two groups to provide two voltage sources. The two groups are the first group of external reference voltage levels [v0,v1, v2,v3,v4,v5,v6,v7] and the second group of external reference voltage levels [v1,v2,v3,v4,v5,v6,v7,v8] respectively. The two voltage sources are respectively coupled to the the second multiplexer 65b and first multiplexer 65a within the reference voltage pair selecting device 50. Besides, the output of the first multiplexer 65a and the second multiplexer 65b are selected according to the MSB three bits [d7,d6,d5] of the digital input signal. To simplify the description of the operation of the device of the present invention, let the output of the first multiplexer 65a to be the first power source $v_h$, and let the output of the first multiplexer 65a to be the second power source $v_l$.

The controlled selectively coupling device 55 includes the first controlled selector 75a and the second controlled selector 75b, the first selector 75a and the second controlled selector 75b are both normal open switches in the preferred embodiment of the present invention. Particularly the "open" or "close" of the first controlled selector 75a is controlled by each bit of the LSB five bits [d4,d3,d2,d1,d0], and the "open" or "close" of the second controlled selector 75b is controlled by the inverse of each bit of the LSB five bits [d4,d3,d2,d1,d0]. So either the voltage of the first power source $v_h$ or the second power source $v_l$ can be selected to be the output of the controlled selectively coupling device 55 at a time interval when the individual bit of the LSB five bits [d4,d3,d2,d1,d0] is fed to the controlled selectively coupling device 55. The LSB five bits [d4,d3,d2,d1,d0] are sequentially fed in the order d0, d1, d2, d3, d4 to the first controlled selector 75a to control the "open" or "close" of the first controlled selector 75a, when the first controlled selector 75a is closed, the output of the controlled selectively coupling device 55 is the voltage of the first power source $v_h$. At this moment, because the inverse of the signal fed to the first controlled selector 75a is coupled to the second controlled selector 75b, so the second controlled selector 75b is open, and the second power source $v_l$ can not be coupled to the controlled selectively coupling device 55. So the output of the controlled selectively coupling device 55 is the voltage of the first power source $v_h$ in the preferred embodiment of the present invention.

Figure 5:
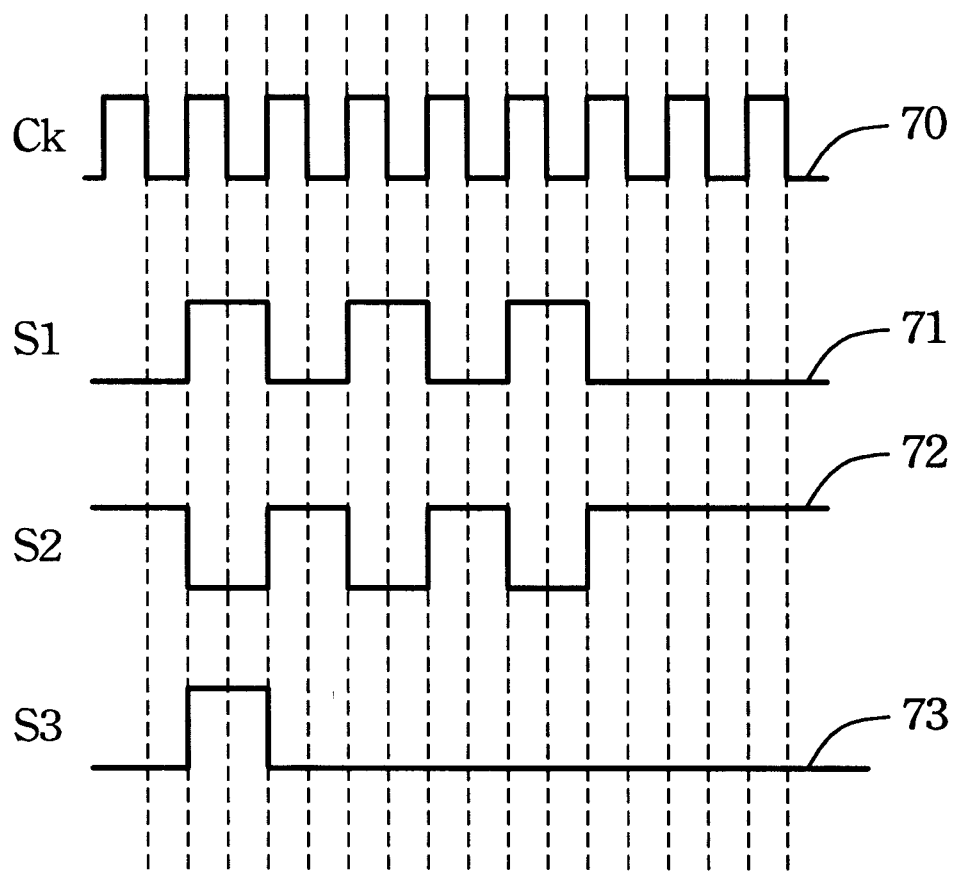
FIG. 5 illustrates the waveform of the clock signal, the first switching signal, the second switching signal, and the third switching signal in the preferred embodiment of the present invention.

In the preferred embodiment of the present invention, the "open" and "close" of the switches in the voltage cumulating device 60 are controlled by the control signal source 65, the start signal St starts the operation, and the clock signal Ck controls the operation of the control signal source 65. It is noted that each bit of the digital input signal [d7,d6,d5,d4, d3,d2,d1,d0] is fed to the digital-to-analog converter according to the present invention responding to the clock signal Ck. The waveform of the clock signal Ck is shown in FIG. 5 as pulse train 70. The plurality of first switches s1, the plurality of second switches s2, and the third switch s3 within voltage cumulating device 60 are controlled by the pulse train 71, 72, and 73 respectively. Observing the waveforms illustrated in FIG. 5, the clock signal Ck lag for a time behind the pulse trains 71, 72, and 73 utilized to control the plurality of first switches s1, the plurality of second switches s2, and the third switch s3. The purpose of the time lag is to ensure the output signal of the controlled selectively coupling device 55 coupled to the plurality of first switches s1, the plurality of second switches s2, and the third switch s3 in its stable state.

When the output of the controlled selectively coupling device 55 is fed to the voltage cumulating device 60 in a first time interval, which represents the time interval that the least significant bit d0 fed to the controlled selectively coupling device 55 responding to the first pulse of the clock signal Ck. In addition, responding to the start signal St, the control signal source 65 output the pulse train 71, 72, and 73 with a time lead 1 to the clock signal Ck, and the voltage cumulating device 60 starts cumulating voltage on the capacitor during the first time interval. During the first time interval, the plurality of first switches s1 and the third switch s3 are closed. So the first capacitor is charged and the second capacitor c2 as well as the third capacitor c3 are reset to clear the charges in the previous time interval. Similarly, when the second least significant bit d1 is fed to the controlled selectively coupling device 55 in a second time interval responding to the second pulse of the clock signal Ck. In other words, when d1 is fed to the first controlled selector 75a, simultaneously, the inverse of d1 is fed to the second controlled selector 75b. Then either the voltage of the first power source $v_h$ or the voltage of the second power source $v_l$ is coupled to the voltage cumulating device 60 in the second time interval by the controlled selectively coupling device 55. Due to each second pulse of the pulse train 71, 72, and 73, the voltage cumulating device 60 continuously cumulate voltage during the second time interval. When the third least significant bit d2 is fed to the controlled selectively coupling device 55 in a third time interval responding to the third pulse of the clock signal Ck. Then either the voltage of the first power source $v_h$ or the voltage of the second power source $v_l$ is coupled to the voltage cumulating device 60 in the third time interval by the controlled selectively coupling device 55. Due to each third pulse of the pulse train 71, 72, and 73, the voltage cumulating device 60 continuously cumulate voltage during the third time interval. When the fifth least significant bit d4 is fed to the controlled selectively coupling device 55 in a fifth time interval responding to the fifth pulse of the clock signal Ck. Then either the voltage of the first power source $v_h$ or the voltage of the second power source $v_l$ is coupled to the voltage cumulating device 60 in the fifth time interval by the controlled selectively coupling device 55. Due to each fifth pulse of the pulse train 71, 72, and 73, the voltage cumulating device 60 continuously cumulate voltage during the fifth time interval. At last, after all the bits of the LSB five bits [d4,d3,d2,d1,d0] had been fed to the controlled selectively coupling device 55, i.e., in the sixth time interval, the sixth pulse of each of the pulse train 71, 72, and 73 make the capacitors in the voltage cumulating device 60 stop charging. Simultaneously, the voltage on the voltage cumulating device 60 represents the analog voltage of the digital input signal [d7,d6,d5,d4,d3,d2,d1,d0].

Because the voltage level of bit d0 may be different from that of bit d1, so the voltage level of the selected power source within the first time interval may be different from that within the second time interval. After all the bits of the LSB five bits [d4,d3,d2,d1,d0] has been fed to the controlled selectively coupling device 55, and an extra duration of a bit has been passed by, the output voltage of the voltage cumulating device 60 is the analog voltage representing the digital input signal [d7,d6,d5,d4,d3,d2,d1,d0].

If there is the other digital signal to be converted to an analog voltage. The control signal source 65 generates the pulse train 71, 72, 73 responding to the start signal St and the clock signal Ck to control the operation of the plurality of first switches s1, the plurality of second switches s2, and the third switch s3. After the time interval next to that corresponding to the fifth LSB has passed, the other digital signal is then converted to an analog voltage. It is noted that the first capacitor c1, the second capacitor c2 and the third capacitor c3 have the same capacitance for storing charge in the preferred embodiment of the present invention.

In order to implement the voltage cumulating device 60, the present invention proposes a circuit diagram that utilizing the pipeline technique and charge-redistribution on capacitor to enable charge-cumulating, thus the voltage cumulating device 60 can cumulate voltage. In one preferred embodiment of the present invention, the voltage cumulating device 60 includes the first capacitor c1, the second capacitor c2, the third capacitor c3, a plurality of first switches s1, a plurality of second switches s2, and a third switch s3. The third capacitor c3 is a redistribution capacitor, and the first capacitor c1 as well as the capacitor c2 are both charging capacitor, which are alternatively charged during various time intervals. When one of the first capacitor c1 and the second capacitor c2, such as the first capacitor c1 is charged with the voltage on one of the selected pair of power source, i.e., $v_h$ or $v_l$, which is coupled by the controlled selectively coupling device 55. The other capacitor, such as the second capacitor c2 is coupled to the third capacitor c3 to proceeds with the redistribution process, so the charges stored in the second capacitor c2 and the third capacitor c3 are uniformly distributed in the second capacitor c2 and the third capacitor c3.

According to the foregoing example, the second capacitor c2 is charged with the voltage on one of the selected pair of power source, i.e., $v_h$ or $v_l$, which is coupled by the controlled selectively coupling device 55 in the next time interval. The other capacitor—the first capacitor c1 is coupled to the third capacitor c3 to proceeds with the redistribution process, so the charges stored in the first capacitor c1 and the third capacitor c3 are uniformly distributed in the first capacitor c1 and the third capacitor c3 in the second time interval. Similarly, one of the first capacitor c1 and the second capacitor c2 is charged, simultaneously, the charge on the other capacitor is redistributed to the third capacitor c3 in the same time interval. In other words, the first capacitor c1 and the second capacitor c2 are alternatively charged during every time interval, which is the time of the clock signal Ck responding to each bit of the LSB five bits [d4,d3,d2,d1,d0] fed to the controlled selectively coupling device 55. Responding to the time interval of the bit following bit d4 has been fed to the controlled selectively coupling device 55, the charges on the first capacitor c1 are uniformly distributed in the first capacitor c1 and the third capacitor c3. At the same time, the charges stored in the third capacitor c3 generates the voltage on the third capacitor c3, which also forms the analog voltage stands for the digital input signal [d7,d6,d5,d4,d3,d2,d1,d0].

To implement the operation of the charging as well as the redistribution process, the third switch s3, the plurality of first switches s1 as well as the plurality of the second switches s2 are designed to be controlled switches that operate as described in the previous description and briefed in table 1.

TABLE 1

| time interval | s1 | s2 | s3 | serial in bit | Operation |
|---|---|---|---|---|---|
| First | 1 | 0 | 1 | d0 | c1 charge, c2 and c3 reset |
| Second | 0 | 1 | 0 | d1 | c2 charge, c1 and c3 redistribute |
| Third | 1 | 0 | 0 | d2 | c1 charge, c2 and c3 redistribute |
| Fourth | 0 | 1 | 0 | d3 | c2 charge, c1 and c3 redistribute |
| Fifth | 1 | 0 | 0 | d4 | c1 charge, c2 and c3 redistribute |
| Sixth | 0 | 1 | 0 | X | c1 and c3 redistribute |

In the preferred embodiment of the present invention, the plurality of first switches s1, the plurality of second switches s2, and the third switch s3 can be transistors which has its gate applied with the voltage on the respective switch. For example, when the bit d0 is fed to the controlled selectively coupling device 55, i.e., when it is within the first time interval, the voltage applied on the plurality of the first switches s1 is high, and the plurality of the first switches s1 close. Simultaneously, the voltage applied on the plurality of the second switches s2 is low, and the plurality of the second switches s2 open. At the same time, the voltage applied on the third switch s3 is high, and the third switch s3 close. Due to the operation mentioned above, the first capacitor c1 is charged, simultaneously, the second capacitor c2 and the third capacitor c3 are reset during the first time interval. In the preferred embodiment of the present invention, the voltage applied on the gate of the plurality of first switches c1 is the inverse of that applied on the gate of the plurality of the second switches c2. The period of the voltage applied on the gate of the third switch s3 is at least the summation of time duration of all the bits from bit d0 to bit d4, depends on the application.

For example, when the bit d1 is subsequently fed to the controlled selectively coupling device 55, i.e., when within the second time interval, the voltage applied on the plurality of the first switches s1 is low, and the plurality of the first switches s1 open. In addition, the voltage applied on the plurality of the second switches s2 is high, and the plurality of the second switches s2 close. At the same time, the voltage applied on the third switch s3 is low, and the third switch s3 open. So the second capacitor c2 is charged, simultaneously, the charges stored in the first capacitor c1 are uniformly distributed in the first capacitor c1 and the third capacitor c3. In the following subsequent time periods, the redistribution process between the third capacitor c3 and one of the first capacitor c1 and the second capacitor c2 alternatively proceed until the time interval after bit d4 has been fed to the controlled selectively coupling device 55. Simultaneously, the other of the first capacitor c1 and the second capacitor c2 is charged. Finally, all the charges redistributed and stored in the third capacitor c3 form the analog voltage representing the digital input signal.

According to the concept of pipeline technology, the present invention enables the third capacitor c3 and the second capacitor c2 proceeding with the redistribution process when the first capacitor proceeding with the charging process. In addition, the third capacitor c3 and the first capacitor c1 proceed with the redistribution process when the second capacitor c2 proceeding with the charging process. So the present invention can raise the speed when transforming digital input signals to analog output voltages.

It is noted that the first multiplexer 65a as well as the second multiplexer 65b select a voltage from the first group of external reference voltage levels [v0,v1,v2,v3,v4,v5,v6,v7] and the second group of external reference voltage levels [v1,v2,v3,v4,v5,v6,v7,v8] respectively according to the MSB three bits [d7,d6,d5]. So the MSB three bits [d7,d6,d5] fed to the first controlled selector 65a and the second controlled selector 65b determine which pair of voltage can be selected from the external reference voltage levels v0–v8 to form the voltage at the first power source $v_h$ and the voltage at the second power source $v_l$. Besides, in the preferred embodiment of the present invention, when $v_l$ equals to $v_M$, the voltage $v_h$ equals to $v_{M+1}$, in which M equals to $(2^2 \times d7 + 2^1 \times d6 + 2^0 \times d5)$. Because the external reference voltage levels [v0,v1,v2,v3,v4,v5,v6,v7,v8] stands for the break points of the transfer curve of the digital-to-analog converter, the designer can adjust the external reference voltage levels to enable the Gamma correction function of the digital-to-analog converter.

To enable the alternatively proceeding with the charging process and the redistribution process of the voltage cumulating device 60, one of the preferred embodiment of the present invention proposes a circuit diagram of the voltage cumulating device 60. In the preferred embodiment of the present invention, the connection between the third switch s3, the plurality of first switches s1 and the plurality of the second switches s2 can be designed as the description below. The first terminal of the first capacitor c1 is electrically coupled to the output terminal of the controlled selectively coupling device 55, i.e. the first capacitor c1 is coupled to the output terminal of the first multiplexer 75a as well as the second multiplexer 75b through one of the plurality of first switches s1. The second terminal of the first capacitor c1 is electrically coupled to the output terminal of the second multiplexer 65b. In addition, the first terminal of the first capacitor c1 is also electrically coupled to the first electrode of the third capacitor c3 through one of the plurality of second switches s2. Similarly, the first terminal of the second capacitor c2 is electrically coupled to the output terminal of the controlled selectively coupling device 55, i.e. the second capacitor c2 is coupled to the output terminal of the first controlled selector 75a and the second controlled selector 75b through one of the plurality of second switches s2. The second terminal of the second capacitor c2 is electrically coupled to the output terminal of the second multiplexer 65b. In addition, the first terminal of the second capacitor c2 is also electrically coupled to the first electrode of the third capacitor c3 through the other one of the plurality of first switches s1.

In addition, the second terminal of the third capacitor c3 is electrically coupled to the second terminal of the second capacitor c2. The first terminal of the third switch s3 is coupled to the first terminal of the third capacitor c3, and the second terminal of the third switch s3 is coupled to the second terminal of the third capacitor c3. The output terminal of the voltage cumulating device 60 is coupled to the first terminal of the third switch s3, and the third switch s3 opened at the duration when the bit d4 is fed to the controlled selectively coupling devices 55. In the time interval next to the time interval corresponding to bit d4, the output voltage vout at the output terminal is the analog voltage representing the digital input signal [d7,d6,d5,d4,d3,d2,d1,d0].

The converting apparatus according to the preferred embodiment of the present invention is of the C-DAC type, and the designer can set the external reference voltage levels to fit the break points of the transfer curve of the digital-to-analog converter. So the converting apparatus can be designed to posses the Gamma correction function. Assume the converting apparatus according to the preferred embodiment of the present invention is a C-DAC having 256 gray levels. In addition, the transfer curve of the converting apparatus has 8 break points, in other words, the transfer curve is piecewise linear between the eight break points. The converting apparatus according to the preferred embodiment of the present invention mentioned above uses only three capacitors and nine power lines. As described in the prior art, the area of the R-DAC is much larger than that of the 2-divided C-DAC. However, the area of the converting apparatus mentioned in the foregoing preferred embodiment of the present invention is much smaller than that of the 2-divided C-DAC described in the prior art.

As will be understood by persons skilled in the art, the foregoing preferred embodiment of the present invention is illustrative of the present invention rather than limiting the present invention. Having described the invention in connection with a preferred embodiment, for example, if the various elements having the same function as that described in the specification is used in the preferred embodiment. As long as the alternative between charging process and redistribution process to the charge capacitor as well as the redistribution capacitor is processed, and the pipeline technique is utilized. The change process in the preferred embodiment of the present invention is within the scope of the present invention disclosed herein, and the modification will now suggest itself to those skilled in the art. While the preferred embodiment of the invention has been illustrated and described, it will be appreciated that various changes can be made therein without departing from scope of the invention.

What is claimed is:

1. Converting apparatus for converting digital input signal to analog voltage, said converting apparatus comprising:
   reference voltage selecting means for coupling a first voltage level from a first set of reference voltage levels to a first output terminal of said reference voltage selecting means as a first power source according to a first portion of said digital input signal, said reference voltage selecting means also coupling a second voltage level within a second set of reference voltage levels to a second output terminal of said reference voltage selecting means as a second power source according to said first portion of said digital input signal;
   controlled selectively coupling means for coupling one of said first power source and said second power source to output terminal of said controlled selectively coupling means as a charge power source according to voltage level of every bit of a second portion of said digital input signal, each bit of said second portion of said digital input signal sequentially fed to said controlled selectively coupling means enabling said controlled selectively coupling means coupling to one of said first power source and said second power source, a starting signal being generated at time when a first bit of said second portion of said digital input signal fed to said converting apparatus; and
   voltage cumulating means for generating said analog voltage, said voltage cumulating means comprising a first storage capacitor, a second storage capacitor, an output capacitor, a first coupling means, a second coupling means, and a third coupling means, said first coupling means, said second coupling means, and said third coupling means operating responding respectively to a first switching signal, a second switching signal, and a third switching signal, said first switching signal, said second switching signal, and said third switching signal being generated responding to a clock signal and said starting signal, said third coupling means electrically coupling both electrodes of said output capacitor during a first duration to proceed with a reset procedure, said first duration being a time interval that a first bit of said first switching signal fed to said first coupling means, one of said first coupling means coupling said first storage capacitor to output terminal of said controlled selectively coupling means during said first duration, the other of said first coupling means coupling said second storage capacitor to said output capacitor during said first duration, simultaneously said second coupling means being opened during said first duration, one of said second coupling means coupling said second storage capacitor to output terminal of said controlled selectively coupling means during a second duration, said second duration being a time interval that a second bit of said switching signal fed to said controlled selectively coupling means, the other of said second coupling means coupling said first storage capacitor to said output capacitor during said second duration, simultaneously said first coupling means being opened during said second duration, after the bit next the last bit of said second portion of said digital input signal have been fed to said controlled selectively coupling means, said output capacitor being electrically coupled to one of said first storage capacitor and said second storage capacitor, then voltage on said output capacitor being equal to said analog voltage, two electrodes of said output capacitor being electrically coupled together only during said first duration, starting time of each of said first and second switching signal leading to the starting time of each bit of said second portion of said digital input signal.

2. Apparatus as claim 1, wherein said converting apparatus further comprising control signal generating means for generating said first switching signal, said second switching signal, and said third switching signal responding to said clock signal and said starting signal.

3. Apparatus as claim 1, wherein said reference voltage selecting means comprising a multiplexer that electrically couples one of said first set of reference voltage levels and of said second set of reference voltage levels to output terminal of said multiplexer to be said first power source and said second power source respectively according to said first portion of said digital input signal.

4. Apparatus as claim 1, wherein said controlled selectively coupling means comprising analog switch that controlled by voltage level of each bit of said second switching signal, one of said first power source and said second power source being coupled to said voltage cumulating means as said charge power source for a duration of every bits of said second portion of said digital input signal.

5. Apparatus as claim 1, wherein said first storage capacitor, said second storage capacitor, and said output capacitor being of same charge capacitance.

6. Apparatus as claim 1, wherein said first coupling means, said second coupling means, and said third coupling means comprising analog switch that controlled respectively by voltage level of each bit of said first switching signal, said second switching signal, and said third switching signal.

7. Converting apparatus for converting digital input signal to analog voltage, said converting apparatus comprising:

a first reference voltage selecting means for coupling a first voltage level from a first set of reference voltage levels to a first output terminal of said first reference voltage selecting means as a first power source according to coding of all bits of a first portion of said digital input signal;

a second reference voltage selecting means for coupling a second voltage level within a second set of reference voltage levels to a second output terminal of said second reference voltage selecting means as a second power source according to coding of all bits of said first portion of said digital input signal;

first controlled selectively coupling means for coupling said first power source to output terminal of said first controlled selectively coupling means according to voltage level of every bits of a second portion of said digital input signal;

second controlled selectively coupling means for coupling said second power source to output terminal of said second controlled selectively coupling means as a charge power source according voltage level of inverse of each bit of said second portion of said digital input signal, output terminals of said first controlled selectively coupling means and said second controlled selectively coupling means being electrically coupled, each bit of said second portion of said digital input signal enabling said first controlled selectively coupling means coupling to one of said first power source and said second power source, a starting signal being generated at time when a first bit of said second portion of said digital input signal fed to said converting apparatus; and voltage cumulating means for generating said analog voltage, said voltage cumulating means comprising a first storage capacitor, a second storage capacitor, an output capacitor, a pair of first coupling means, a pair of second coupling means, and third coupling means, said first pair of coupling means, said second pair of coupling means, and said third coupling means operating responding respectively to a first switching signal, a second switching signal, and a third switching signal, said first switching signal, said second switching signal, and said third switching signal being generated responding to a clock signal and said starting signal, said third coupling means electrically coupling both electrodes of said output capacitor during a first duration to proceed with a reset procedure, said first duration being a time interval that a first bit of said first switching signal fed to said first pair of coupling means, one of said first coupling means coupling said first storage capacitor to output terminal of said first controlled selectively coupling means during said first duration, the other of said first coupling means coupling said second storage capacitor to said output capacitor during said first duration, simultaneously said second coupling means being opened during said first duration, one of said second pair of coupling means coupling said second storage capacitor to output terminal of said first controlled selectively coupling means during a second duration, said second duration being a time interval that a second bit of said first switching signal fed to said first controlled selectively coupling means, the other of said second coupling means coupling said first storage capacitor to said output capacitor during said second duration, simultaneously said first coupling means being opened during said second duration, after the bit next to the last bit of said second portion of said digital input signal have been fed to said first controlled selectively coupling means, said output capacitor being electrically coupled to one of said pair of first storage capacitor and said pair of second storage capacitor, then voltage on said output capacitor being equal to said analog voltage, two electrodes of said output capacitor being electrically coupled together only during said first duration, starting time of each of said first and second switching signal leading to the starting time of each bit of said second portion of said digital input signal.

8. Apparatus as claim 7, wherein said converting apparatus further comprising control signal generating means for generating said first switching signal, said second switching signal, and said third switching signal responding to said clock signal and said starting signal.

9. Apparatus as claim 7, wherein said first reference voltage selecting means comprising a multiplexer that selecting one of said first set of reference voltage levels as an output of said multiplexer to be said first power source according to coding of said first portion of said digital input signal.

10. Apparatus as claim 7, wherein said second reference voltage selecting means comprising a multiplexer that selecting one of said second set of reference voltage levels as an output of said multiplexer to be said second power source according to coding of said first portion of said digital input signal.

11. Apparatus as claim 7, wherein said first controlled selectively coupling means comprising analog switch that respectively controlled by voltage level of each bit of said first switching signal, said second signal, and said third switching signal.

12. Apparatus as claim 7, wherein said second controlled selectively coupling means comprising analog switch that respectively controlled by voltage level of each bit of said first switching signal, said second signal, and said third switching signal.

13. Apparatus as claim 7, wherein one of said first power source and said second power source being coupled to said voltage cumulating means as said charge power source for duration of each bit of said second portion of said digital input signal.

14. Apparatus as claim 7, wherein said first storage capacitor, said second storage capacitor, and said output capacitor being of same charge capacitance.

15. Apparatus as claim 1, wherein said pair of first coupling means, said pair of second coupling means, and said third coupling means comprising analog switch that controlled respectively by voltage level of each bit of said first switching signal, said second switching signal, and said third switching signal.

16. Apparatus as claim 7, wherein said third coupling means electrically coupling both electrodes of said output capacitor during a first duration, said first duration being a time interval that a first bit of said second portion of the digital input signal fed to said voltage cumulating means, one of said pair of first coupling means coupling said first storage capacitor to said charge power source during said first duration, the other of said pair of first coupling means coupling said second storage capacitor to said output capacitor during said first duration, simultaneously said pair of second coupling means being opened during said first duration, one of said pair of second coupling means coupling said second storage capacitor to said power source during a second duration, said second duration being a time interval that a second bit of said second portion of the digital input signal fed to said pair of first controlled selectively coupling means, the other of said pair of second coupling means coupling said first storage capacitor to said output capacitor during said second duration, simultaneously said pair of first coupling means being opened during said second duration.

17. A method for converting digital input signal to analog voltage, said method comprising:

generating a starting signal responding to said digital input signal;

generating a first switching signal, a second switching signal, and a third switching signal responding to said starting signal and a clock signal;

dividing a plurality of reference voltage levels to a first set of reference voltage levels and a second set of reference voltage levels;

selecting a first voltage level from said first set of reference voltage levels as a first power source according to coding of bits of a first portion of said digital input signal, simultaneously selecting a second voltage level from said second set of reference voltage levels as a second power source according to coding of bits of a first portion of said digital input signal;

selecting one of said first power source and said second power source as a charge power source according to voltage level of every bit of a second portion of said digital input signal, thus one of said first power source and said second power source being selected as said charge power source responding to duration of every bit of one of said first switching signal, said second switching signal, and said third switching signal;

proceeding with a reset process by charging a first storage capacitor by said charge power source within duration of a first bit of said second portion of the digital input signal, simultaneously, coupling a second storage capacitor and an output capacitor;

proceeding with a first capacitor charging, second capacitor redistribution process by charging a first storage capacitor by said charge power source within duration of a second bit of said second portion of the digital input signal, simultaneously, coupling said second storage capacitor and said output capacitor;

proceeding with a first capacitor redistribution, second capacitor charging process by charging said second storage capacitor by said charge power source within duration of a third bit of said second portion of the digital input signal, simultaneously, coupling said second storage capacitor and said output capacitor, total charges of said output capacitor and said first storage capacitor being uniformly distributed on said output capacitor and said first storage capacitor; and alternatively proceeding with said first capacitor charging, second capacitor redistribution process and said first capacitor redistribution, second capacitor charging process, after the bit next to the last bit of said second portion of said digital input signal having been used to select one of said first power source and said second power source as said charge power source, and then proceeding one more said charging redistribution process, said output capacitor being electrically coupled to one of said first storage capacitor and said second storage capacitor, then voltage on said output capacitor being equal to said analog voltage.

18. The method as claim 17, wherein number of said first set of reference voltage levels is equal to 2 base power x, said x being number of bits of said first portion of said digital input signal.

19. The method as claim 18, wherein number of said second set of reference voltage levels is equal to two with number of said first portion of said digital input signal in order.

* * * * *